US012625434B2

(12) United States Patent
Chang et al.

(10) Patent No.: US 12,625,434 B2
(45) Date of Patent: May 12, 2026

(54) LITHOGRAPHY SCANNER THROUGHPUT

(71) Applicant: Taiwan Semiconductor Manufacturing Company, LTD., Hsinchu (TW)

(72) Inventors: Kai-Chieh Chang, Changhua (TW); Che-Chang Hsu, Taichung (TW); Kai-Fa Ho, New Taipei (TW); Li-Jui Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 231 days.

(21) Appl. No.: 18/512,488

(22) Filed: Nov. 17, 2023

(65) Prior Publication Data

US 2025/0164892 A1 May 22, 2025

(51) Int. Cl.
*G03F 7/00* (2006.01)

(52) U.S. Cl.
CPC ...... *G03F 7/70358* (2013.01); *G03F 7/70725* (2013.01)

(58) Field of Classification Search
CPC ............. G03F 7/70358; G03F 7/70433; G03F 7/70725
See application file for complete search history.

(56) References Cited

U.S. PATENT DOCUMENTS

| | | | | |
|---|---|---|---|---|
| 5,617,182 A | * | 4/1997 | Wakamoto | G03F 7/70358 355/53 |
| 7,897,942 B1 | | 3/2011 | Bareket et al. | |
| 2002/0051125 A1 | | 5/2002 | Suzuki | |
| 2002/0186359 A1 | | 12/2002 | Meisburger et al. | |
| 2004/0098160 A1 | * | 5/2004 | Galburt | G03F 7/70725 700/121 |
| 2005/0024610 A1 | * | 2/2005 | Nishi | G03F 7/70725 355/53 |
| 2006/0139593 A1 | | 6/2006 | Nagasaka et al. | |
| 2006/0197930 A1 | | 9/2006 | Kawashima et al. | |
| 2008/0198351 A1 | * | 8/2008 | Lin | G03F 7/70425 355/53 |
| 2017/0363948 A1 | * | 12/2017 | Rops | G03F 7/70341 |
| 2018/0356736 A1 | * | 12/2018 | Danilin | G03F 7/70516 |

FOREIGN PATENT DOCUMENTS

| | | |
|---|---|---|
| JP | 2000029223 A | 1/2000 |
| TW | 202332986 A | 8/2023 |

OTHER PUBLICATIONS

Taiwan Office Action for Application No. 11420990320 Dated Sep. 19, 2025.

* cited by examiner

*Primary Examiner* — Steven H Whitesell
(74) *Attorney, Agent, or Firm* — Lippes Mathias LLP

(57) ABSTRACT

A method and system for optimizing scan speed of a lithography scanner. A process design layout corresponding to a plurality of rows of fields to be formed on an associated wafer is received and a default machine constant of the lithography scanner is determined. Each of the plurality of rows is then identified corresponding to the received process design layout. A scan speed for each determined type of row and the determined default machine constant is then determined. The associated wafer is then processed utilizing the determined scan speed for each of the plurality of rows in accordance with the process design layout.

20 Claims, 17 Drawing Sheets

200

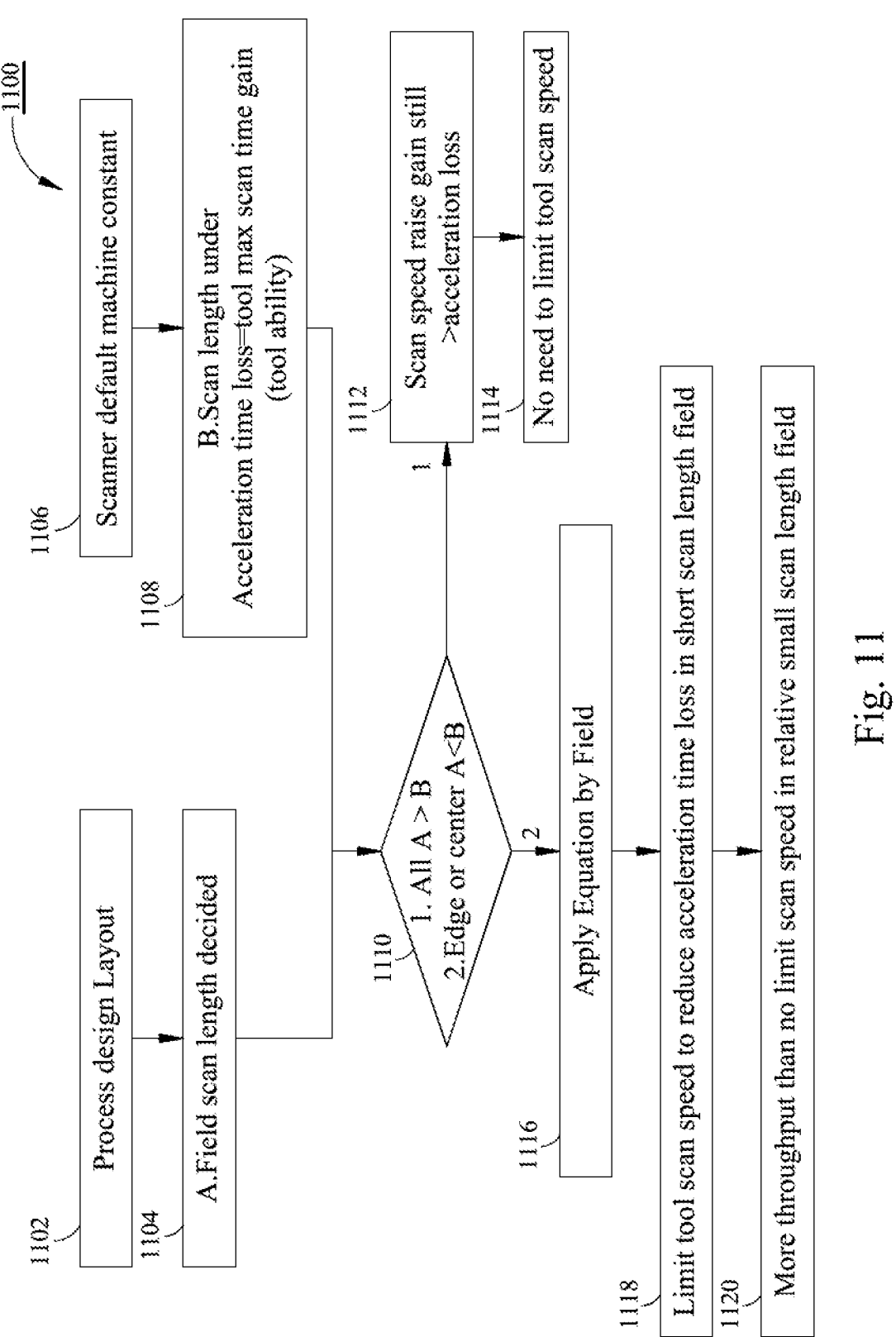

1100

1106    Scanner default machine constant

1108    B. Scan length under
Acceleration time loss=tool max scan time gain
(tool ability)

1112    Scan speed raise gain still
>acceleration loss

1114    No need to limit tool scan speed

1102    Process design Layout

1104    A. Field scan length decided 1110    1. All A > B
2. Edge or center A<B

1116    Apply Equation by Field

1118    Limit tool scan speed to reduce acceleration time loss in short scan length field 1120    More throughput than no limit scan speed in relative small scan length field

Fig. 11

LITHOGRAPHY SCANNER THROUGHPUT

BACKGROUND

A lithographic apparatus is a machine that utilizes a reticle (i.e., photomask) that applies a desired pattern onto a target portion of a substrate. The reticle may be a reflective mask or a transmission mask. In the process, ultraviolet light is reflected off the surface of the reticle (for a reflective mask) or transmitted through the reticle (for a transmission mask) to transfer the pattern to a photoresist onto a target portion of a semiconductor wafer. The minimum feature size of the pattern is limited by the light wavelength. Deep ultraviolet (UV) lithography uses a wavelength of 193 nm or 248 nm. Extreme ultraviolet (EUV) light, which spans wavelengths from 124 nanometers (nm) down to 10 nm, is currently being used to provide small minimum feature sizes. A lithographic scanner is one type of such apparatus, in which each target portion is exposed by scanning the reticle through a projection beam in a given direction, while simultaneously scanning (i.e. moving) the wafer substrate parallel or anti-parallel to this direction. The scanning speed of the scanner affects not only quality but also throughput.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is a flowchart illustrating a method for optimizing scan speed of a lithography scanner in accordance with some embodiments.

DETAILED DESCRIPTION

Figure 1:
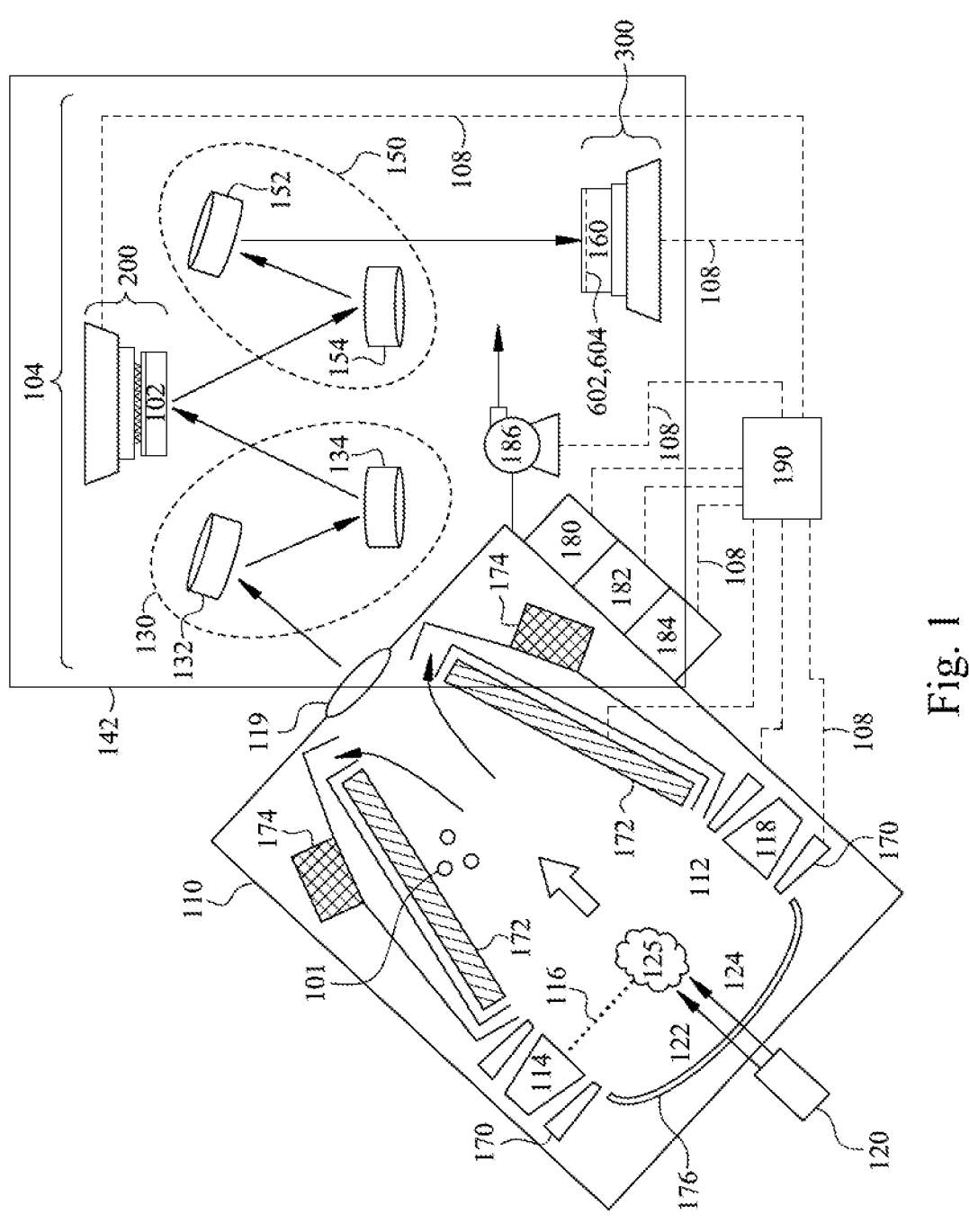
FIG. 1 is a schematic view of a lithography system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g., "about 2 to about 4" also discloses the range "from 2 to 4." The term "about" may refer to plus or minus 10% of the indicated number.

The present disclosure may refer to temperatures for certain method steps. It is noted that these references are to the temperature at which the heat source is set, and do not specifically refer to the temperature which must be attained by a particular material being exposed to the heat.

In the present disclosure, the terms "photolithographic mask", "mask", "photomask", and "reticle" are used interchangeably.

A lithographic apparatus can be used, for example, in the manufacture of integrated circuits (ICs), flat panel displays and other devices involving fine structures. In a conventional lithographic apparatus, a mask or a reticle may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., a photoresist material).

In manufacturing using lithography, one key performance indicator for the reduction of production costs is better throughput. The improvement of throughput in lithography scanners is generally accomplished via hardware upgrades or continuous improvement process of photoresist. However, both of these items require extra cost, time and effort to develop and implement, resulting in little throughput gain while suffering an increased risk of worse overlay (OVL)/ focus range. Thus, the systems and methods set forth herein provide increased throughput by varying the scan speed based upon the scan length of a field.

In accordance with some embodiments, the systems and methods set forth hereinafter, there is provided a method for determining the optimal scan speed of a lithographic scanner in accordance with the scan length of the wafer layout to increase throughput. As used herein, the term "scan length" corresponds to the length of a field of exposure on a wafer, e.g., the distance between exposures. For example, after exposure, the wafer stage assembly moves (or the reticle stage assembly moves) a predetermined distance to enable exposure of the next field on the wafer. In some embodiments, the term "scan speed" or "scanner speed" refers to the velocity of movement of the wafer (i.e., movement of the reticle stage assembly and/or wafer stage assembly, as discussed below). For example, the scan speed may correspond to the velocity at which the wafer moves from one field to another field. In accordance with some embodiments, the term "step time" corresponds to the amount of time required to move from one field to another field. For example, the time taken to move the wafer to enable exposure of a field. The term "scan time" may be defined as the scan length divided by the scan speed. The term "exposure time" may be generally expressed as the sum of scan time and step time (i.e., exposure time=Σ(scan time+step time)).

Referring now to FIG. 1, there is shown a schematic view of an exemplary lithography system 100 in accordance with some embodiments. It will be appreciated that while depicted in FIG. 1 as a EUV lithography system 100, the systems and methods described herein are suitably configurable for any lithographic system, and the reference herein to a EUV lithography system 100 is intended to exemplify and not to limit the subject application. Accordingly, FIG. 1 provides a schematic diagram, not drawn to scale, illustrating various components of an EUV lithography system 100 utilizing scan speed optimization and throughput improvement in accordance with the systems and methods set forth herein. Generally, the EUV lithography system 100 includes an EUV light source 110 that generates EUV light and a laser source 120. Downstream of the EUV light source 110 is an illumination stage 130, which collects and focuses the EUV light on the reticle 102. Downstream of the reticle 102 is the projection optics module 150, which is configured for imaging the pattern of the reticle 102 (i.e., photomask) onto a substrate 160, such as a semiconductor wafer. The EUV lithography system 100 may include other modules or be integrated with or coupled to other modules. Operations of the EUV lithography system 100 may be controlled by a controller 190 communicatively coupled to the various components and modules described herein. The controller 190 is described in greater detail below with respect to FIG. 4.

The EUV light source 110 itself includes a radiation source chamber 112 which encloses the plasma reaction that creates EUV light. The radiation source chamber 112 includes a target droplet generator 114. The target droplet generator 114 deposits a plurality of target droplets 116 into the radiation source chamber 112. In some embodiments, the target droplets 116 are tin (Sn) droplets. In other embodiments, the target droplets 116 may include alternative types of material, for example, a tin-containing liquid material such as eutectic alloy containing tin or lithium (Li). The tin droplets 116 may be deposited at a rate, for example of about 50 thousand droplets per second.

A laser source 120 is also present, which emits one or more laser beams into the radiation source chamber 112 that contact the target droplets 116 to produce EUV light. In some embodiments, the laser source 120 may be a carbon dioxide ($CO_2$) or a neodymium-doped yttrium aluminum garnet (Nd:YAG) laser source. The laser source 120 may be a multi-stage laser having a plurality of stages configured to amplify laser light produced by a prior stage. In some embodiments, the laser source 120 may produce multiple beams. For example, as illustrated in FIG. 1, a pre-heat laser pulse 122 can be used to create a low-density target plume, which is subsequently heated (or reheated) by a main laser pulse 124 that generates EUV light. The laser source 120 generally also includes optics and other focal components for directing the laser beams in a desired direction.

The radiation source chamber 112 includes windows or lenses, which are substantially transparent to the laser wavelength. The generation of the laser beams is synchronized with the target droplets 116. The pre-heat laser pulse 122 heats the target droplets and expands them into lower-density target plumes. A delay between the pre-pulse 122 and the main pulse 124 is controlled to allow the target plume to form and to expand to an optimal size and geometry. When the main pulse 124 heats the target plume, a high-temperature plasma field 125 is generated. The plasma 125 emits EUV radiation in all directions. The EUV light travelling in the wrong direction (i.e. away from the output port) is collected by a collector mirror 176.

The collector mirror 176 has a reflective surface that reflects and focuses EUV light. In some embodiments, the collector mirror 176 has an ellipsoidal shape. The collector mirror 176 may be coated with materials similar to that of the reticle 102 for reflecting EUV light. EUV light is then directed towards an output port 119, through which the EUV light exits the EUV light source 110 to enter the rest of the EUV lithography system 100. A droplet catcher 118 may be installed opposite the target droplet generator 114. The droplet catcher 118 is used to catch excess target droplets 116.

In the EUV light source 110, the plasma 125 caused by the laser application creates EUV light and also creates physical debris, such as ions, gases and atoms of the droplet 116. To prevent the accumulation of particulate and debris on the collector mirror 176, a buffer gas can be injected along the surface of the collector mirror via gas ports 170. The buffer gas can be $H_2$, He, Ar, $N_2$, or some other inert gas, but is usually hydrogen. Hydrogen gas has a low EUV absorption profile. Hydrogen will react with metals to form a metal hydride. In particular, hydrogen will react with tin to form $SnH_4$ as a gaseous product at the temperatures of the EUV generation process, which can be captured and pumped out. The gaseous $SnH_4$ is then pumped out of the radiation source chamber 112.

Other debris collection mechanisms may also be present. For example, to further trap residual tin particles and other debris 101, the interior of the radiation source chamber 112 may include a plurality of vanes 172 disposed around a frustoconical support frame which narrows in diameter from the plasma field to the output port 119. The vanes 172 extend generally radially inwards from the support frame. The vanes 172 may be made, for example, from molybdenum or stainless steel. The temperature of the vanes 172 may be controlled to keep tin in a liquid state but not a gaseous state, or in other words above about 231° C. but not a gaseous state, 1,100° C. (at the operating pressure of the EUV light source). For example, the vanes 172 may include channels through which a liquid or gas can be flowed. The liquid or gas may be heated or cooled, as appropriate, to obtain a desired temperature for the vanes 172. The vanes 172 may also be shaped to direct the liquid tin to an appropriate drain, for example via capillary action and/or wicking action. It will be appreciated that because gas molecules absorb EUV light, the radiation source chamber 112 is typically maintained at vacuum or a low-pressure environment to avoid EUV intensity loss. Accordingly, the EUV lithography system 100 includes one or more vacuum pumps 186 fluidically coupled to the radiation source chamber 112 and operable in conjunction with the controller 190, as illustrated in FIG. 1.

In some embodiments, the radiation source chamber 112 may be equipped with one or more sensors 180, 182, 184 in communication with the controller 190, as illustrated in FIG. 1. In such embodiments, the one or more sensors 180, 182, and 184 may respectively correspond to temperature sensors (thermometer), pressure gauges, and/or flow meters. Operations of the radiation source chamber 112 may be controlled by the controller 190 in accordance with output of the one or more sensors 180, 182, 184, as will be appreciated by the skilled artisan.

The EUV lithography system 100 depicted in FIG. 1 further includes a process chamber 142 wherein a lithographic scanner 104 is disposed to transfer a pattern from the reticle 102 to an exposure field 602, 604 (as illustrated further in FIG. 6) on the substrate or wafer 160. As generally illustrated in FIG. 1, the lithographic scanner 104 includes a reticle stage assembly 200 and a wafer stage assembly 300 for processing of the wafer 160.

The reticle stage assembly 200 is described in greater detail below with respect to FIGS. 2A and 2B. In accordance with some embodiments, the reticle stage assembly 200 is configured to move the reticle 102 within the process chamber 142 in the x-direction, y-direction, and/or z-direction, as discussed below. The lithographic scanner 104 may further include a wafer stage assembly 300 configured to hold the wafer 160 and in some embodiments, move within the process chamber 142 in the x-direction, y-direction, and/or z-direction during operations of the EUV lithography system 100.

The wafer stage assembly 300 is described in greater detail below with respect to FIG. 3. In the illumination stage 130, the EUV light may be collected and focused as a beam, for example using field facet mirror 132 that splits the beam into a plurality of light channels. These light channels can then be directed using one or more relay mirrors 134 onto the plane of the reticle 102. The projection optics module 150 may include refractive optics or reflective optics for carrying the image of the pattern defined by the photomask. Illustrative mirrors 152, 154 are shown. The pattern is then focused onto substrate 160, which may be for example a silicon wafer.

Figure 2A:
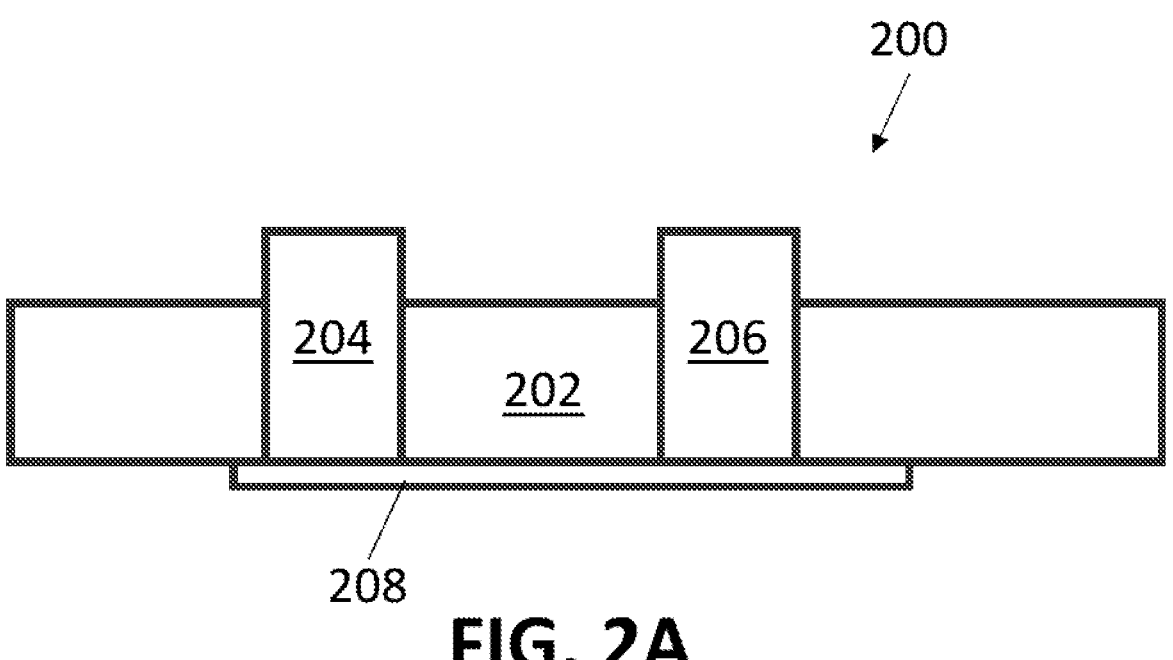
FIG. 2A is a side view of a reticle stage assembly used in the lithography system of FIG. 1 in accordance with some embodiments.
Figure 2B:
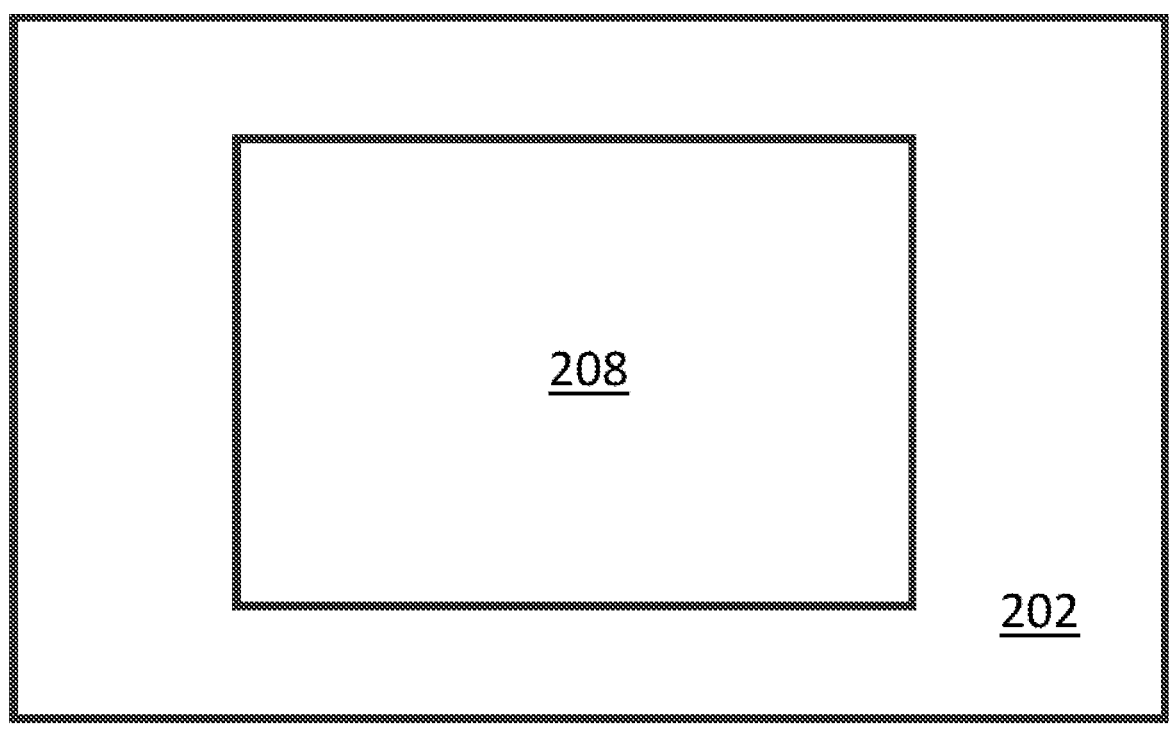
FIG. 2B is a bottom view of a reticle stage assembly used in the lithography system of FIG. 1 in accordance with some embodiments.

Referring now to FIGS. 2A-2B, there are shown side and bottom views, respectively, of the reticle stage assembly 200 utilized by the lithographic scanner 104 of the EUV lithography system 100 according to some embodiments. The reticle stage assembly 200 includes a reticle stage assembly body 202 configured to support a reticle 102, and conduct movement of the reticle 102 in accordance with processing operations of the EUV lithography system 100. In the exemplary illustration of FIG. 2A, the reticle stage assembly 200 includes one or more motors 204, coupled to the reticle stage assembly body 202 configured to move the reticle stage assembly 200 in the x-direction and y-direction during exposure processing by the EUV lithography system 100. The reticle stage assembly 200 of FIG. 2A further illustrates one or more motors 206 coupled to the reticle stage assembly body 202 and configured to move the reticle stage assembly 200 in the z-direction. FIG. 2B provides a bottom view of the reticle stage assembly 200 in accordance with some embodiments. As shown in FIG. 2B, the reticle stage assembly body 202 includes a reticle clamp 208 configured to retain the reticle 102 during operations of the EUV lithography system 100. In some embodiments, the reticle clamp 208 may be implemented as an electrostatic reticle clamp. The skilled artisan will appreciate that other securing means, fasteners, etc., may be utilized in accordance with other embodiments.

Figure 3:
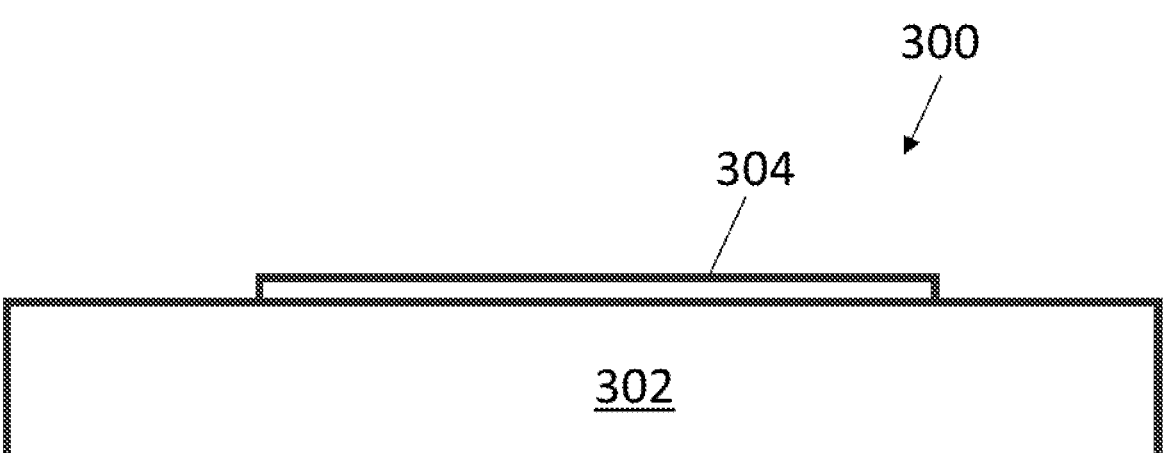
FIG. 3 is a side view of a wafer stage assembly used in the lithography system of FIG. 1 in accordance with some embodiments.

FIG. 3 provides an illustrative view the wafer stage assembly 300 of the lithographic scanner 104 utilized by the EUV lithography system 100 in accordance with some embodiments. As shown in FIG. 3, the wafer stage assembly 300 includes a wafer stage body 302, equipped with a wafer retention component, e.g., an electrostatic chuck 304 configured to hold a wafer 160 for processing within the lithographic processing chamber 142. In accordance with some embodiments, the wafer stage assembly 300 may include one or more sensors (not shown) configured to sense position of the wafer 160, position of the wafer stage assembly 300, temperature associated with the electrostatic chuck 304 or wafer 160, speed, exposure power, duration, etc., or the like.

As will be appreciated, during the exposure process within the process chamber 142, the reticle stage assembly 200 and the wafer stage assembly 300 may be moving relative to each other. The relative speed of the reticle stage assembly 200 and the wafer stage assembly 300 may be referred to as the scanner speed. In some embodiments, such speed may be the result of movement of either the reticle stage assembly 200 and the wafer stage assembly 300 relative to each other, movement of the reticle stage assembly 200 relative to the fixed position of the wafer stage assembly 300, movement of the wafer stage assembly 300 relative to the fixed position of the reticle stage assembly 200, etc. Operations of the EUV lithography system 100 will be better understood in conjunction with the methods set forth in FIG. 5 described in greater detail below.

Figure 4:
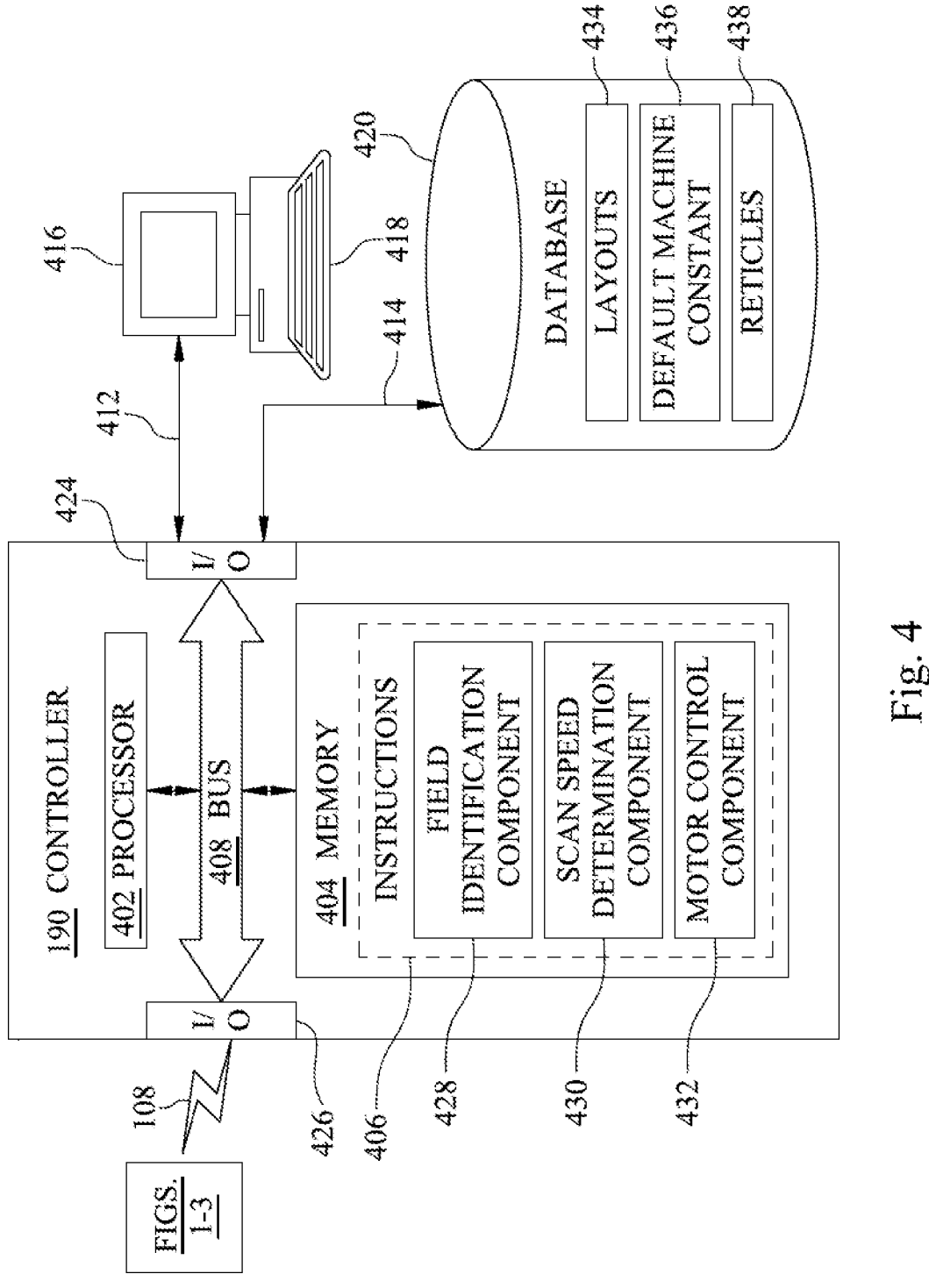
FIG. 4 illustrates a block diagram of a controller in accordance with some embodiments.

Turning now to FIG. 4, there is shown an illustrative block diagram of a suitable controller 190 associated with the EUV lithography system 100, the aforementioned reticle stage assembly 200 and wafer stage assembly 300 in accordance with one embodiment of the subject application. The various components of the controller 190 may be connected by a data/control bus 408. The processor 402 of the controller 190 is in communication with an associated database 420 via a link 414. A suitable communications link 414 may include, for example, a switched telephone network, a wireless radio communications network, infrared, optical, or other suitable wired or wireless data communications. The database 420 is capable of implementation on components of the controller 190, e.g., stored in local memory 404, i.e., on hard drives, virtual drives, or the like, or on remote memory accessible to the controller 190.

The associated database 420 is representative of any organized collections of data (e.g., process tool information, fabrication information, motor control information, scanning speed information, photoresist information, process layout information, design information, material information, etc.) used for one or more purposes. The skilled artisan will appreciate that such information may be updated via machine learning during operations of the subject EUV lithography system 100. Implementation of the associated database 420 is capable of occurring on any mass storage device(s), for example, magnetic storage drives, a hard disk drive, optical storage devices, flash memory devices, or a suitable combination thereof. The associated database 420 may be implemented as a component of the controller 190, e.g., resident in memory 404, or the like. In one embodiment, the associated database 420 may include data corresponding to process design layouts 434, default machine constant 436, reticle information 438, tool information, temperature information, and the like. In other embodiments, the database 420 may further include, for example and without limitation, production scheduling, wafer positioning, process chamber information (e.g., type, position, status, etc.), and the like.

In accordance with one embodiment, the processing design layout 434 stored in the database 420 may correspond to a particular processing protocols for the production of a wafer (e.g., materials to be used, photomasks/reticles to be used, EUV energy to be applied, and the like). In some embodiments, the process design layout 434 may correspond to information relating to the fields 602, 604 to be formed on the wafer 160. For example and without limitation, the process design layout 434 may include the number of fields, scan speed, exposure dosage, recipe to be used, type of wafer 160, temperature restrictions/requirements, and the like. The default machine constant 436 stored in the database 420 may correspond to information relating to the default scan speed of the lithographic scanner 104, as discussed in greater detail below. The database 420 may further include reticle information 438 corresponding to information about a particular reticle 102, e.g., steady-state temperature, thickness, material, corresponding recipe(s), etc.

The controller 190 may include one or more input/output (I/O) interface devices 424 and 426 for communicating with external devices. The I/O interface 424 may communicate, via communications link 412, with one or more of a display device 416, for displaying information, such estimated destinations, and a user input device 418, such as a keyboard or touch or writable screen, for inputting text, and/or a cursor control device, such as mouse, trackball, or the like, for communicating user input information and command selections to the processor 402. The I/O interface 422 may communicate with external devices such as the radiation source chamber 112, the process chamber 142, the reticle stage assembly 200 (e.g. motors 204, 206), the reticle clamp 208, wafer stage assembly 300, electrostatic chuck 304, and the like, via a suitable the communications link 108.

It will be appreciated that the controller 190 illustrated in FIG. 4 is capable of implementation using a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or any suitable combination thereof. Accordingly, such a computer network comprises physical layers and transport layers, as illustrated by various conventional data transport mechanisms, such as, for example and without limitation, Token-Ring, Ethernet, or other wireless or wirebased data communication mechanisms. Furthermore, while depicted in FIG. 4 as a networked set of components, the controller 190 is capable of implementation on a stand-alone device adapted to interact with the lithography system 100, the reticle stage assembly 200, and the wafer stage assembly 300 described herein.

The controller 190 may include one or more of a computer server, workstation, personal computer, cellular telephone, tablet computer, pager, combination thereof, or other computing device capable of executing instructions for performing the exemplary method.

According to one example embodiment, the controller 190 includes hardware, software, and/or any suitable combination thereof, configured to interact with an associated user, a networked device, networked storage, remote devices, or the like.

The memory 404 illustrated in FIG. 4 as a component of the controller 190 may represent any type of non-transitory computer readable medium such as random access memory (RAM), read only memory (ROM), magnetic disk or tape, optical disk, flash memory, or holographic memory. In one embodiment, the memory 404 comprises a combination of random access memory and read only memory. In some embodiments, the processor 402 and memory 404 may be combined in a single chip. The network interface(s) 424, 426 allow the computer to communicate with other devices via a computer network, and may comprise a modulator/demodulator (MODEM). Memory 404 may store data processed in the method as well as the instructions for performing the exemplary method.

The digital processor 402 can be variously embodied, such as by a single core processor, a dual core processor (or more generally by a multiple core processor), a digital processor and cooperating math coprocessor, a digital controller, or the like. The digital processor 402, in addition to controlling the operation of the controller 190, executes instructions 406 stored in memory 404 for performing the method set forth hereinafter.

As shown in FIG. 4, the instructions 406 stored in memory 404 may include a field identification component 428 configured to identify each field 602, 604 (illustrated more fully in FIG. 6) in a process design layout 434. In some embodiments, the field identification component 428 is further configured to identify each field 602, 604 as an edge field or a center field, wherein an edge field corresponds to a partial field positioned on an edge of the wafer 160, and a center field corresponds to a full field formed on the wafer 160, as illustrated and discussed in greater detail below with respect to FIGS. 5-7C. In accordance with some embodiments, determination as to field type by the field identification component 428 may utilize information relating to the reticle 102, the size of the wafer 160, the position of the field 602, 604 on the wafer 160 (as indicated by the process design layout 434), exposure time, and the like.

As illustrated in FIG. 4, the instructions 406 stored in memory 404 may also include a scan speed determination component 430 configured to determine the optimum scan speed for processing of a wafer 160 in accordance with the process design layout 434. In some embodiments, the scan speed determination component 430 may be configured to determine a maximum scanning speed for each field 602, 604 of a process design layout 434. In such embodiments, the scan speed may be determined for each field 602, 604 in accordance with its corresponding identification, e.g., an edge field may have a slower or faster scan speed than a center or full field. Additional discussion on the determination of the optimum scan speed is presented below with respect to FIGS. 5-8.

The instructions 406 stored in memory 404 may further include motor control component 432 configured to control operations of the motors 204, 206 during operations of the EUV lithography system 100. In accordance with some embodiments, the motor control component 432 may be in communication with the reticle stage assembly 200 and the wafer stage assembly 300, receiving position data therefrom and directing movement thereof via control signals sent to the motors 204, 206. It will be appreciated that the control signals sent to the reticle stage assembly 200 and/or wafer stage assembly 300 may direct movement in the x-direction, the y-direction and/or the z-direction, as needed during processing of a wafer 160 by the EUV lithography system 100. Thus, the motor control component 432 may move the reticle stage assembly 200 and/or the wafer stage assembly 300 so as to align the reticle 102 with a portion of the wafer 160 for exposure thereon by the EUV lithography system 100. The various components and hardware described above with respect to FIGS. 1-4 may be configured to perform and implement the methods set forth in greater detail below, e.g., the methods illustrated in the flowchart of FIG. 5.

The term "software," as used herein, is intended to encompass any collection or set of instructions executable by a computer or other digital system so as to configure the computer or other digital system to perform the task that is the intent of the software. The term "software" as used herein is intended to encompass such instructions stored in storage medium such as RAM, a hard disk, optical disk, or so forth, and is also intended to encompass so-called "firmware" that is software stored on a ROM or so forth. Such software may be organized in various ways, and may include software components organized as libraries, Internet-based programs stored on a remote server or so forth, source code, interpretive code, object code, directly executable code, and so forth. It is contemplated that the software may invoke system-level code or calls to other software residing on a server or other location to perform certain functions.

Figure 5:
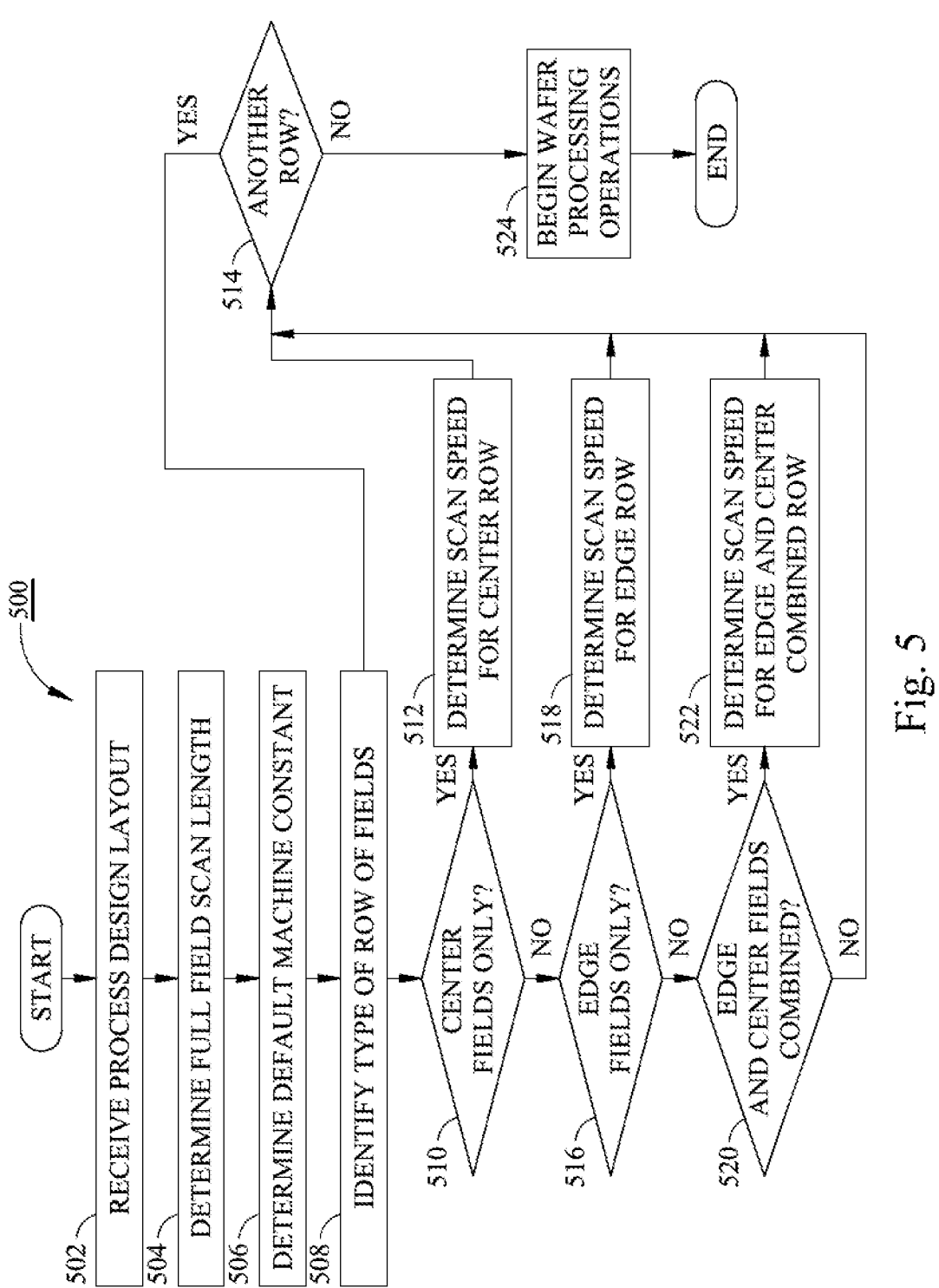
FIG. 5 is a flowchart illustrating a method for optimizing scan speed of a lithography scanner in accordance with some embodiments.
Figure 6:
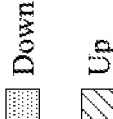
FIG. 6 is an illustrative example of a wafer scan down/scan up routing in accordance with some embodiments.

The operations of the EUV lithography system 100 will be better understood in conjunction with the flowchart 500 of FIG. 5 and the illustration of downward scanned fields 602 and upward scanned fields 604 depicted on the wafer 160 of FIG. 6. As used herein, the downward scanned fields 602 correspond to exposure through the reticle 102 while the reticle stage assembly 200 is moving down (towards the bottom) the page (i.e., y-direction) and the upward scanned fields 604 correspond to exposure through the reticle 102 while the reticle stage assembly 200 is moving up (towards the top) the page (i.e., y-direction). Note that in FIG. 6, the scan direction $D_{scan}$ is the vertical direction, and the downward scanned fields 602 and the upward scanned fields 604 are also indicated by different hatching patterns. That is, determining the best scanning speed of the lithographic scanner 104 in accordance with the different scan lengths associated with a particular layout, thereby increasing throughput of the EUV lithography system 100. It will be appreciated by those skilled in the art that such a determination includes utilization of the particulars of the lithographic scanner 104, e.g., maximum/minimum speeds of movement of the reticle stage assembly 200 and/or wafer stage assembly 300, size of the field, field scan length, location/position of the field on the wafer 160, and the like.

As shown, the controller 190 or other suitable component associated with the EUV lithography system 100 receives a process design layout 434 at 502 corresponding to the layout to be used on an associated wafer 160. In some embodiments, the process design layout 434 includes exposure time, exposure power (e.g., dose, duration, etc.), and the like. At 504, the field scan length associated with each field 602, 604 is determined or decided by the controller 190 in accordance with the process design layout 434. At step 506, the lithography scanner 104 default machine constant 436 is determined, e.g., acceleration, maximum/minimum scan speeds, etc. In some embodiments, the default machine constant 436 is retrieved from the database 420. In other embodiments, the default machine constant 436 is determined in accordance with the operational characteristics of the motors 204, 206 effectuating movement of the reticle stage assembly 200 and/or wafer stage assembly 300.

Figure 7A:
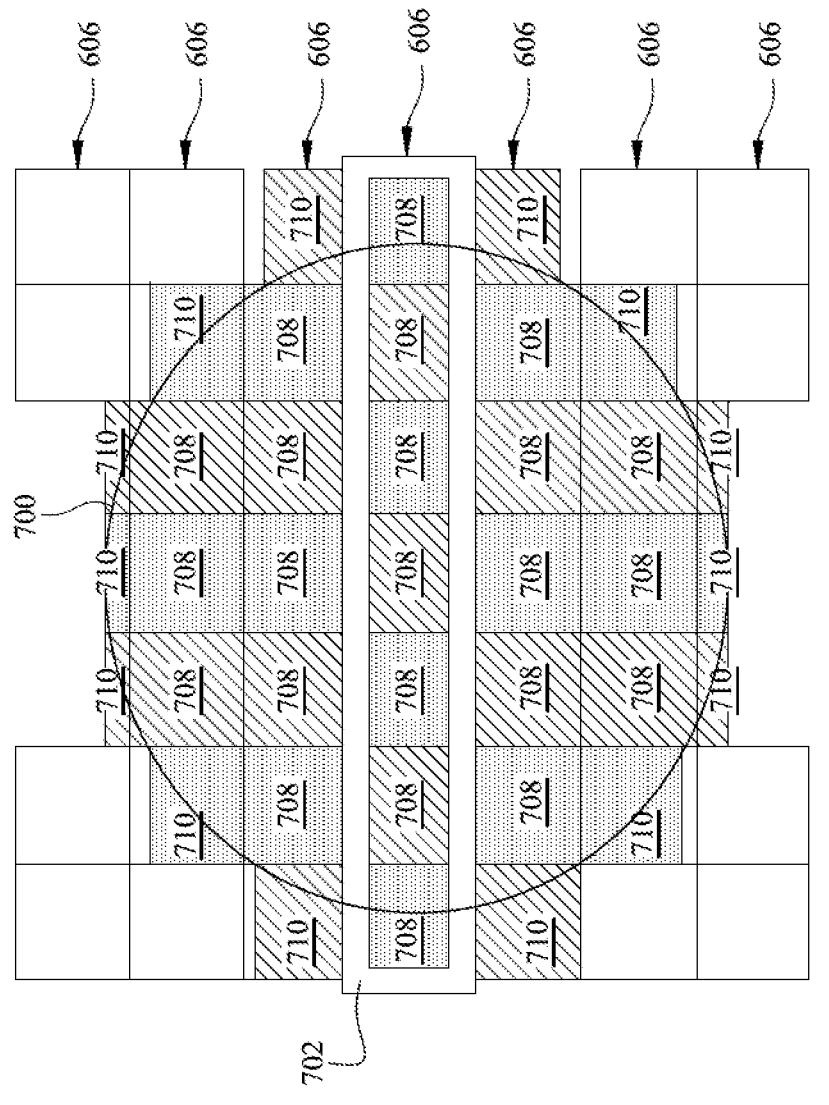
FIGS. 7A-7C are a simplified illustrative example of fields on a wafer in accordance with some embodiments.
Figure 7B:
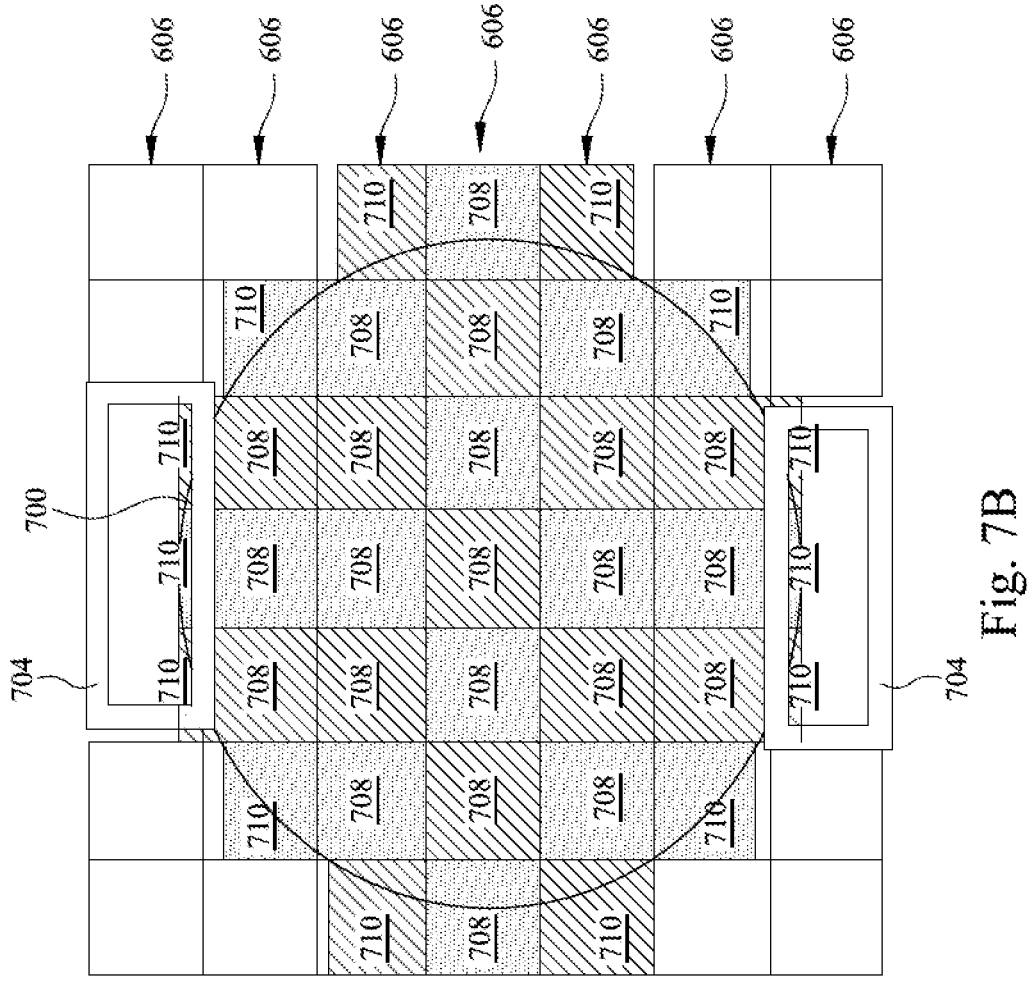
Figure 7C:
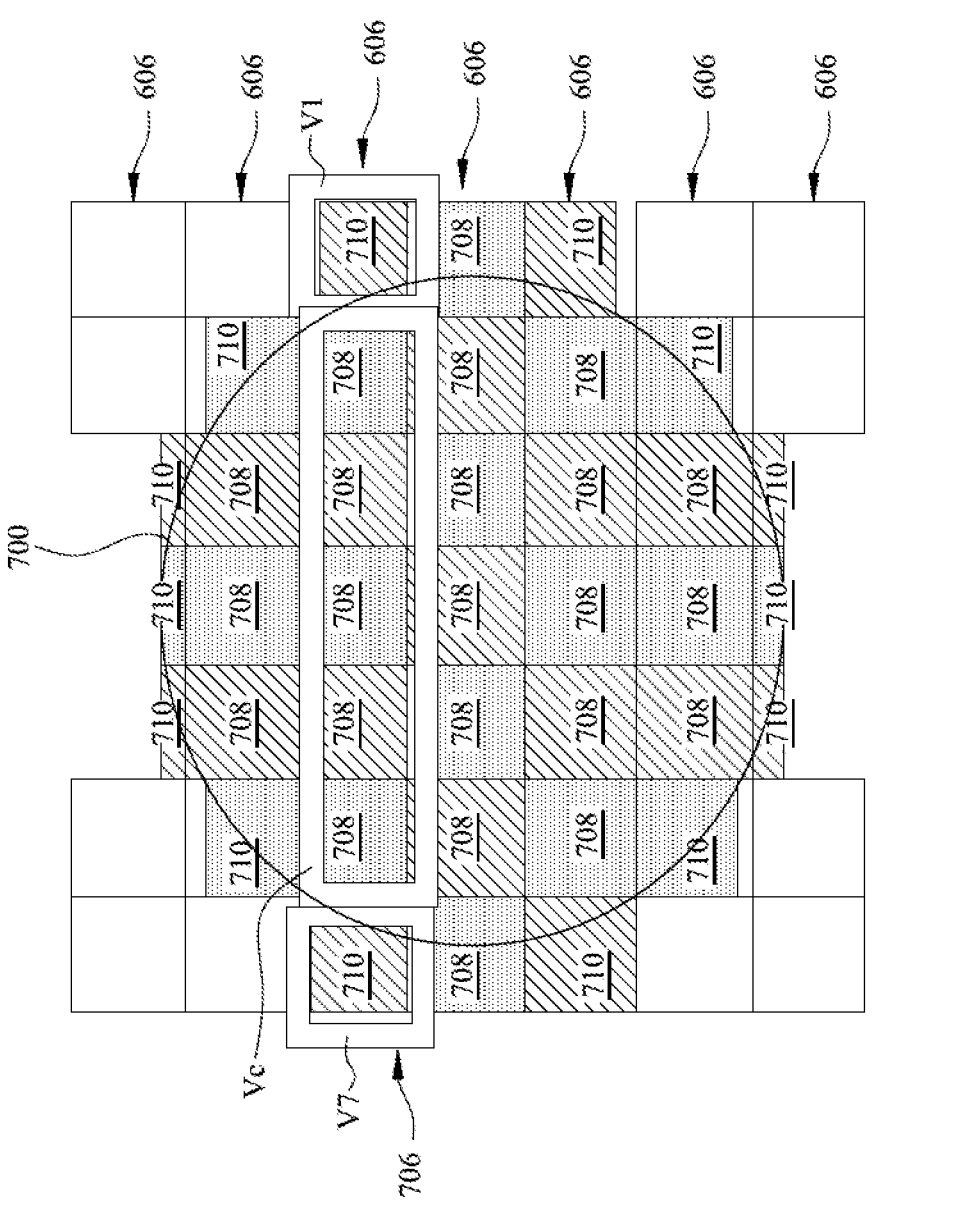

Operations then proceed to step 508, whereupon a type of row 606 of fields 602, 604 is identified by the controller 190 or other suitable component associated with the EUV lithography system 100. It will be appreciated that the process design layout 434 may include a plurality of rows 606, each row 606 containing one or more fields 602, 604. For example, in FIG. 6, there are shown nine (9) rows 606 of fields 602, 604 overlayed on the wafer 160. The skilled artisan will appreciate that the number or rows 606 may be dependent upon the size of the wafer 160, the size of the fields 602, 604, and the like. Accordingly, the illustration of FIG. 6 is intended as a non-limiting example of a number of rows 606 and fields 602, 604. In accordance with one embodiment, a row 606 may be identified as a center field only row, an edge field only row, or an edge and center fields combined row. FIGS. 7A, 7B, and 7C provide simplified illustrative examples of types of rows, i.e., a center field only row 702, an edge field only row 704, or an edge and center fields combined row 706, respectively.

Thus, in FIG. 7A, a wafer 700 is illustrated on which a plurality of fields 602 (downward scan), 604 (upward scan) are formed in accordance with a process design layout. (Again, the scan direction $D_{scan}$ is the vertical direction in the illustrative example of FIGS. 7A, 7B, and 7C; additionally, the downward scanned fields and the upward scanned fields are indicated by the different hatching patterns also used in FIG. 6). A center field row 702 is outlined, which contains only center fields, i.e., a full field 708 exposed/formed on the wafer 160. That is, center fields 708 correspond to a usable portion of the wafer 160 on which a semiconductor device is formed. Stated another way, a center field represents a portion of the wafer 160 intended for end use, i.e., a microprocessor, MEMS device, sensor, integrated circuit, etc. FIG. 7B illustrates edge only rows 704 of the wafer 700, corresponding to fields 710 located on the top edge and bottom edge of the wafer. As illustrated in FIG. 7B, each of the fields 710 located in the edge row 704 correspond to fields 710 that are not complete formations from the exposure of the reticle 102. That is, the portions of the wafer 700 in the edge row 704 are unusable portions and are not intended for end use products. FIG. 7C illustrates an edge and center fields combined row 706, which contains both center and edge fields 708-710. As shown in FIG. 7C, the edge fields 710 are depicted as only applied to a portion of the edge of the wafer 700, whereas the center fields 708 of the combined row 706 are fully exposed on the wafer 700. As illustrated in FIGS. 7A-7C, each center field 708 is depicted as having a full scan length (where the full scan length is along the scan direction $D_{scan}$, i.e., the vertical direction in FIGS. 7A, 7B, and 7C, and a particular scan may be either an upward scan or a downward scan as indicated by the different hatch patterns), whereas each edge field 710 has a scan length less than the full scan length (where the less than full scan length is again along the scan direction $D_{scan}$, i.e. the vertical direction in FIGS. 7A-7C, and again the upward or downward direction is indicated by the different hatch patterns). The skilled artisan will appreciate that the depictions in FIGS. 7A-7C are intended solely to illustrate the contents of the rows 702-706, and a wafer 160, 700 may comprise a plurality of such rows 702-706 depending upon the size of the fields 708-710, the size of the wafer 700, and the like.

Figure 8:
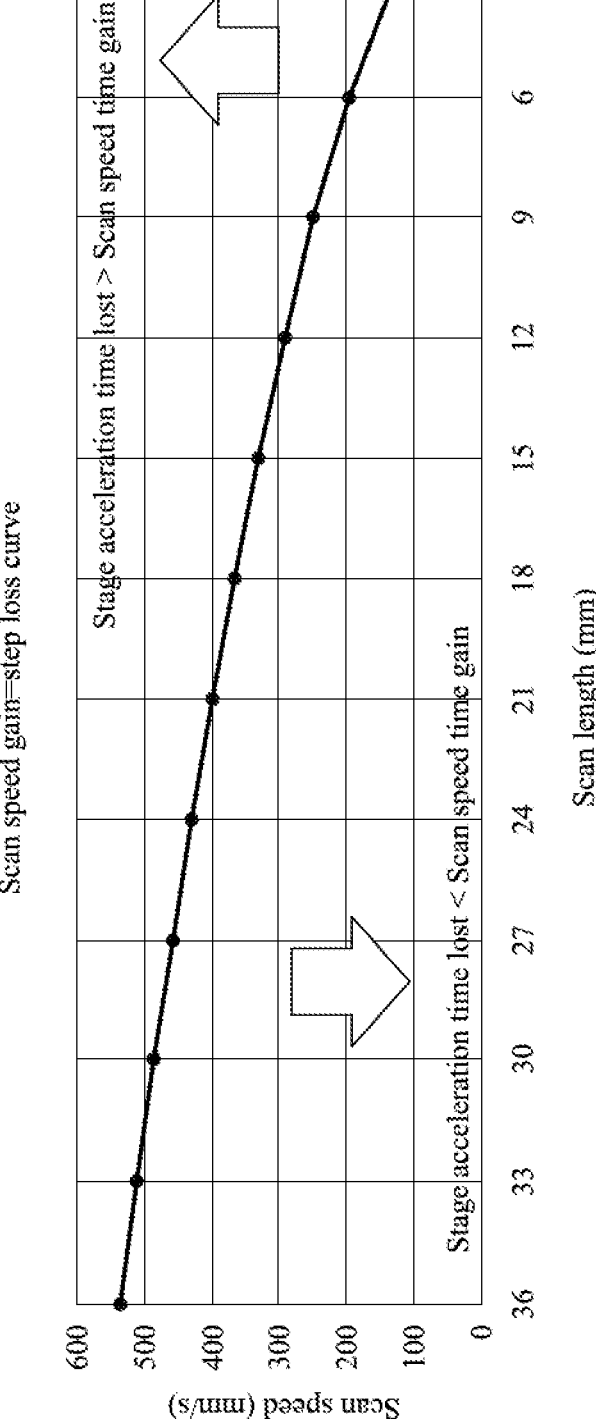
FIG. 8 is an illustrative graph of scan speeds in accordance with some embodiments.
Figures 9A, 9B:
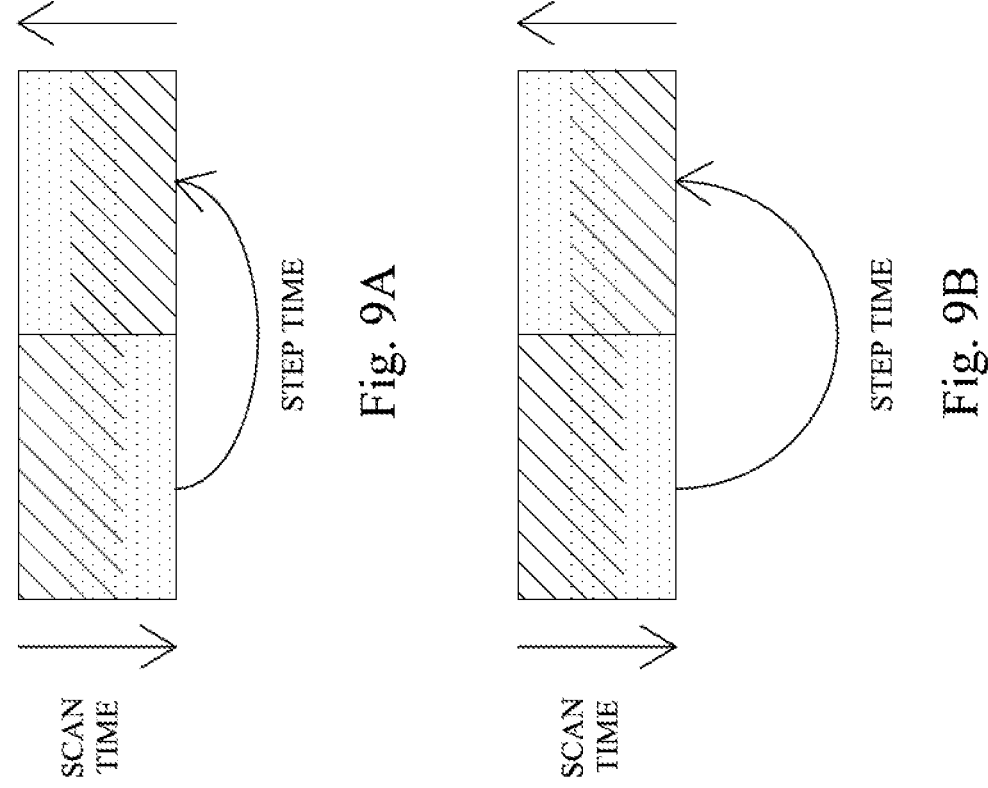
FIGS. 9A-9B provide simplified representations of scanning time and step time in accordance with some embodiments.

Returning to FIG. 5, a determination is made at step 510 whether the row 606 has been identified as a center field only row 702. Upon a positive determination, operations proceed to 512, whereupon the maximum scan speed for the fields in this row 702 is determined. In accordance with one embodiment, the full-size fields in the wafer center, i.e., the center row 702, may be a boundary condition. Determination of the maximum scan speed may therefore be determined by differentiating the following two equations:

$$\text{Scan time} = \frac{\text{scan length}}{\text{scan speed}} \tag{eq. 1}$$

$$RS \text{ accerlation time} = \tag{eq. 2}$$
$$\frac{2 \times \text{sca speed} - \text{accerlation}^2/\text{jerk}}{\text{accerlation}} + 2\left(\frac{\text{accerlation}}{\text{jerk}}\right)$$

Where RS acceleration time corresponds to time required to move the reticle stage assembly 200, "sca speed" corresponds to the scan speed, and "jerk" corresponds to the differential of acceleration where acceleration is not reaching the default machine constant 436. Wherein, a change in the higher scan speed direction time (acceleration)=higher scan speed through time gain, as expressed in chart illustrated in FIG. 8. In some embodiments, the edge field row scan speed is less than or equal to the center field row scan speed depending upon the scan length and the default machine constant 436. In other embodiments, the edge field row scan speed is less than or equal to the center field row scan speed depending upon the size of the field 708, 710 and the default machine constant 436. As a non-limiting example, if the scan length of the full field 708 in the center field row 702 is 12 mm, then the maximum scan speed for these full fields 708 would be 300 mm/s to gain optimal throughput (as shown in FIG. 8). Thus, if the machine maximum scan speed is 500 mm/s, and full field scan length is 12 mm, then this will not equate to an optimal throughput due to amount of time required for the lithographic scanner 104 to accelerate to the next field. See, e.g., FIGS. 9A and 9B, wherein FIG. 9A illustrates a slow scan speed, smaller acceleration time (as denoted by a thin arrow) and FIG. 9B illustrates a fast scan speed, longer acceleration time (as denoted by a thick arrow), i.e., longer amount of acceleration required to achieve the faster scan speed. Operations then proceed to step 514, whereupon a determination is made whether any further rows 600 remain for identification. Upon a positive determination operations return to step 508, whereupon the next row 606 is identified.

When it is determined at 510 that the identified row 606 is not a center field only row 702, operations proceed to step 516, whereupon a determination is made whether the identified row 606 is an edge field only row 704 (as shown in FIG. 7B). Upon a positive determination, operations proceed to step 518, whereupon the optimum or best scan speed for the edge fields 710 is determined. In some embodiments, determination of the optimum scan speed for the edge fields 710 may be determined using the following equation:

$$\sum t_n(v, y) = \frac{y_n}{v_n} + s_n(v_n, v_{n-1}) \tag{eq. 3}$$

Where:
t-exposure time=scan nth field exposure spend time;
v-scan speed=exposure speed by scan;
y-scan length=layout decided the field size Y in wafer region; and
s-step time=prepare scan speed/move to next field spend time.

Figure 10A:
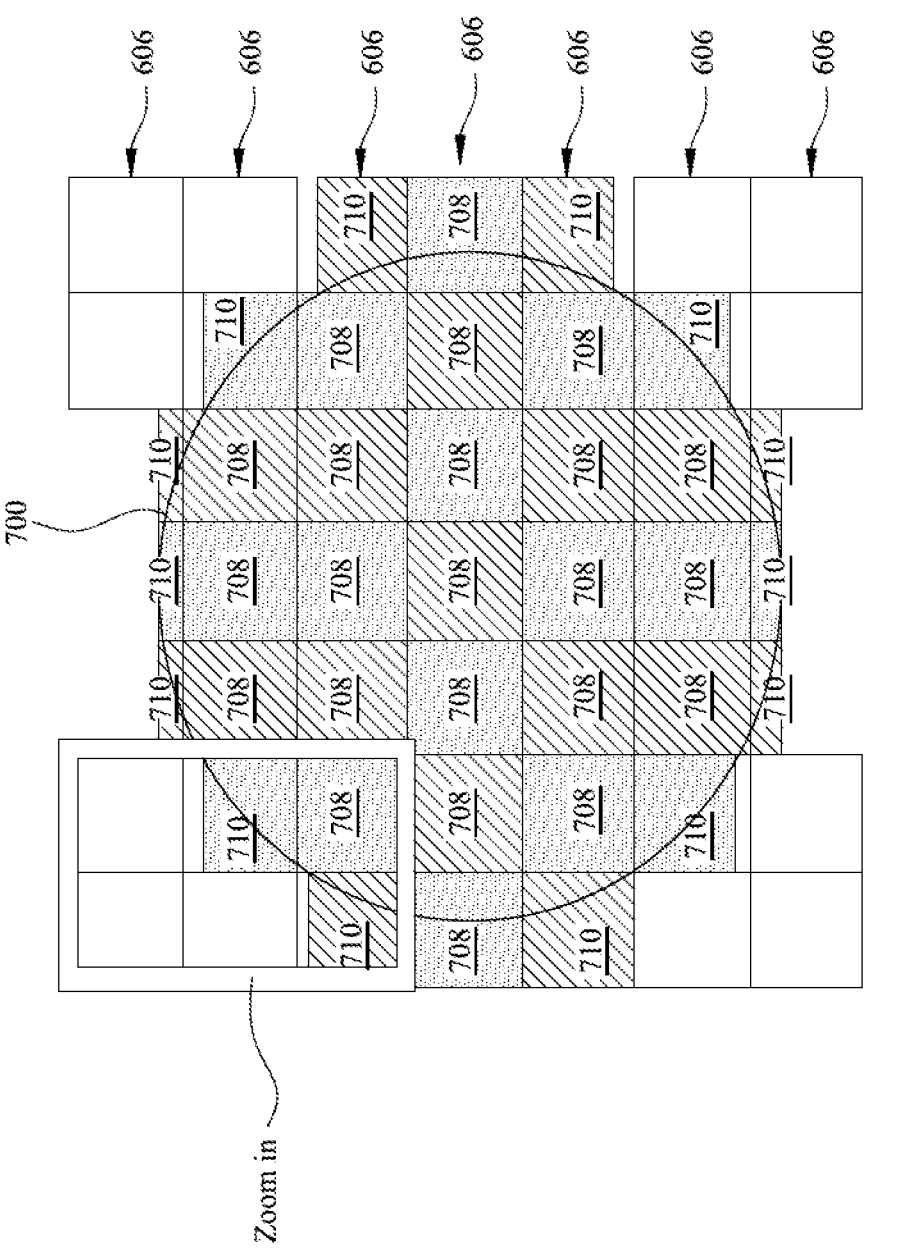
FIGS. 10A-10C provide an illustrative view of the difference in scan lengths in accordance with some embodiments.
Figure 10B:
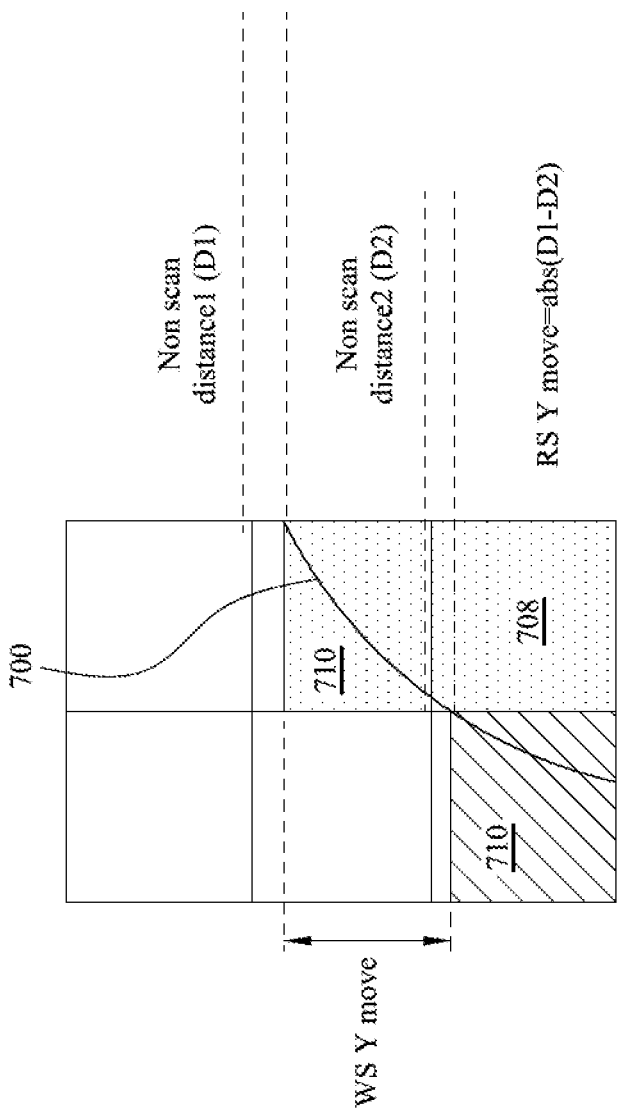
Figure 10C:
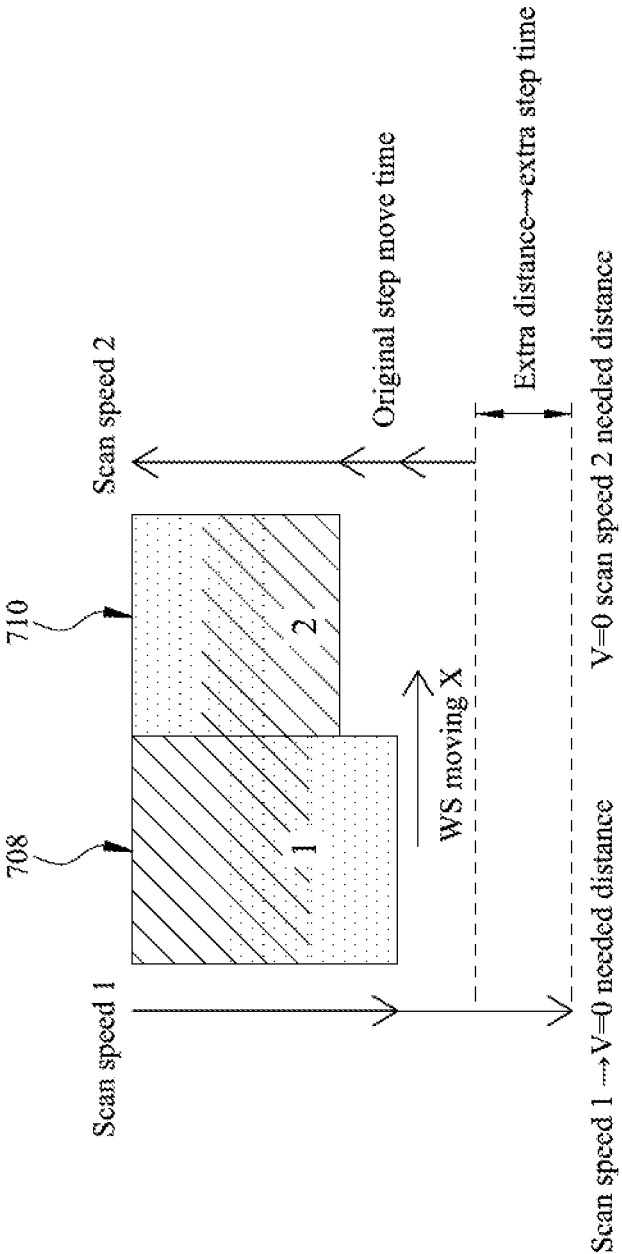

It will be appreciated that utilizing the same scan speed for different scan lengths will not produce optimum throughput. Thus, the above fitting method determines the least time sum, such that a single field scan speed for the longest scan length field is greater than or equal to the scan speed $(s_n)$ which is greater than or equal to the single field scan speed for the shortest scan length field. Furthermore, utilizing different scan speeds in the full fields (i.e., center fields 708 of center field rows 702) will induce extra moving distance, thus also not producing optimum throughput. See FIG. 10C illustrating a Scan speed 1 for an illustrative center field 708 compared with a different Scan speed 2 for an illustrative edge field 710, thus inducing extra moving distance (and corresponding extra step time) 712. After determination of the scan speed for the edge field row(s) 704, operations proceed to step 514 to determine whether other rows 606 remain for processing. Upon a positive determination operations return to step 508, whereupon the next row 606 is identified.

When it is determined at 510 that the identified row 606 is not a center field only row 702, operations proceed to step 516, whereupon a determination is made whether the identified row 606 is an edge field only row 704. When it is determined at 516 that the identified row 606 is not an edge field row 704, operations proceed to step 520 whereupon a determination is made whether the identified row 606 is an edge and center fields combined row 706 (as shown in FIG. 7C). Upon a positive determination, operations proceed to step 522, whereupon the optimum or best scan speed for the edge fields 710 is determined. In the combined row 706, the center field 708 portions may utilize the previously determined scan speeds (step 512), and the edge field 710 portions may utilize the scan speed determined (step 518).

Upon a determination at 520 that the identified row 606 is not an edge and center combined row 706, operations return to step 514, whereupon a determination is made whether another row 606 remains for processing. Upon a negative determination at step 514 that no more rows 606 remain for processing, operations proceed to step 524, whereupon operations of the EUV lithography system 100 commence on the wafer 160 utilizing the determined scan speeds for each identified row 606. FIGS. 10A-10C provide an illustrative view of the difference in scan lengths for edge fields 710 relative to the scan lengths for center fields 708 in accordance with some embodiments, where FIG. 10B shows an enlarged view of the region 720 indicated in FIG. 10A. FIGS. 10B and 10C provide additional information as to the movements of the reticle stage assembly (RS) 200 and the wafer stage assembly (WS) 300 during scanning operations of the lithography scanner 104, as labeled in FIG. 10B. Thus, as illustrated in FIGS. 10A-10C, the scanning speed of the lithography scanner 104 may be limited to reduce acceleration time loss (i.e., step time) due to the shortened scan field length. This results in more throughput than a no limit scan speed in the relatively small scan length of edge fields 710.

Turning now to FIG. 11, there is shown a flowchart 1100 illustrating another embodiment of a method for optimizing scan speed of a lithography scanner 104. The method 1100 begins at step 1102, whereupon the controller 190 or other suitable component associated with the EUV lithography system 100 receives a process design layout 434 corresponding to the layout to be used on an associated wafer 160. At 1104, the field scan length (A) associated with each field 708, 710 is determined or decided by the controller 190 in accordance with the process design layout 434. At step 1106, the lithography scanner 104 default machine constant 436 is determined, e.g., acceleration, maximum/minimum scan speeds, etc. In some embodiments, the default machine constant 436 is retrieved from the database 420. In other embodiments, the default machine constant 436 is determined in accordance with the operational characteristics of the motors 204, 206 effectuating movement of the reticle stage assembly 200 and/or wafer stage assembly 300.

Figure 12A:
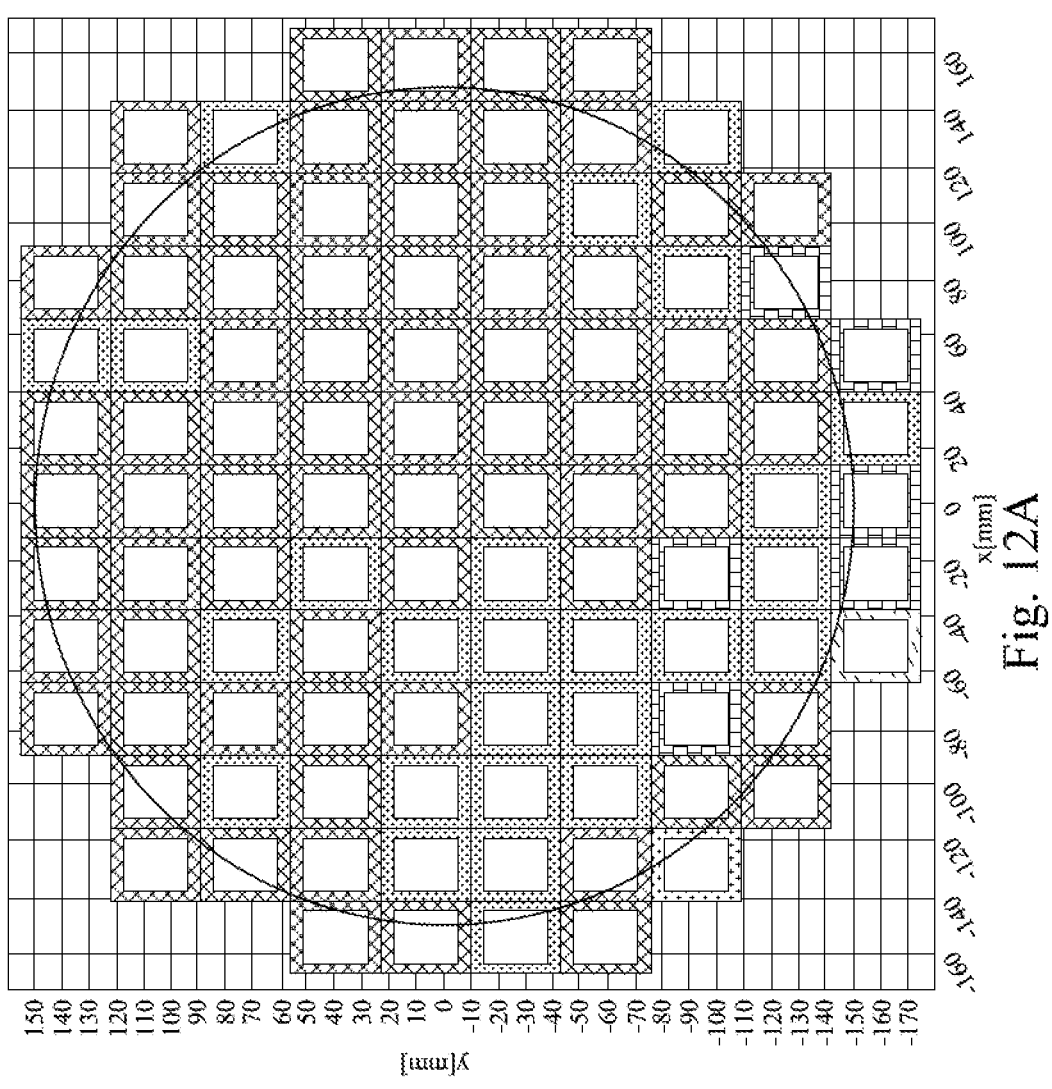
FIGS. 12A-12B are comparative examples of output performance in accordance with some embodiments.
Figure 12B:
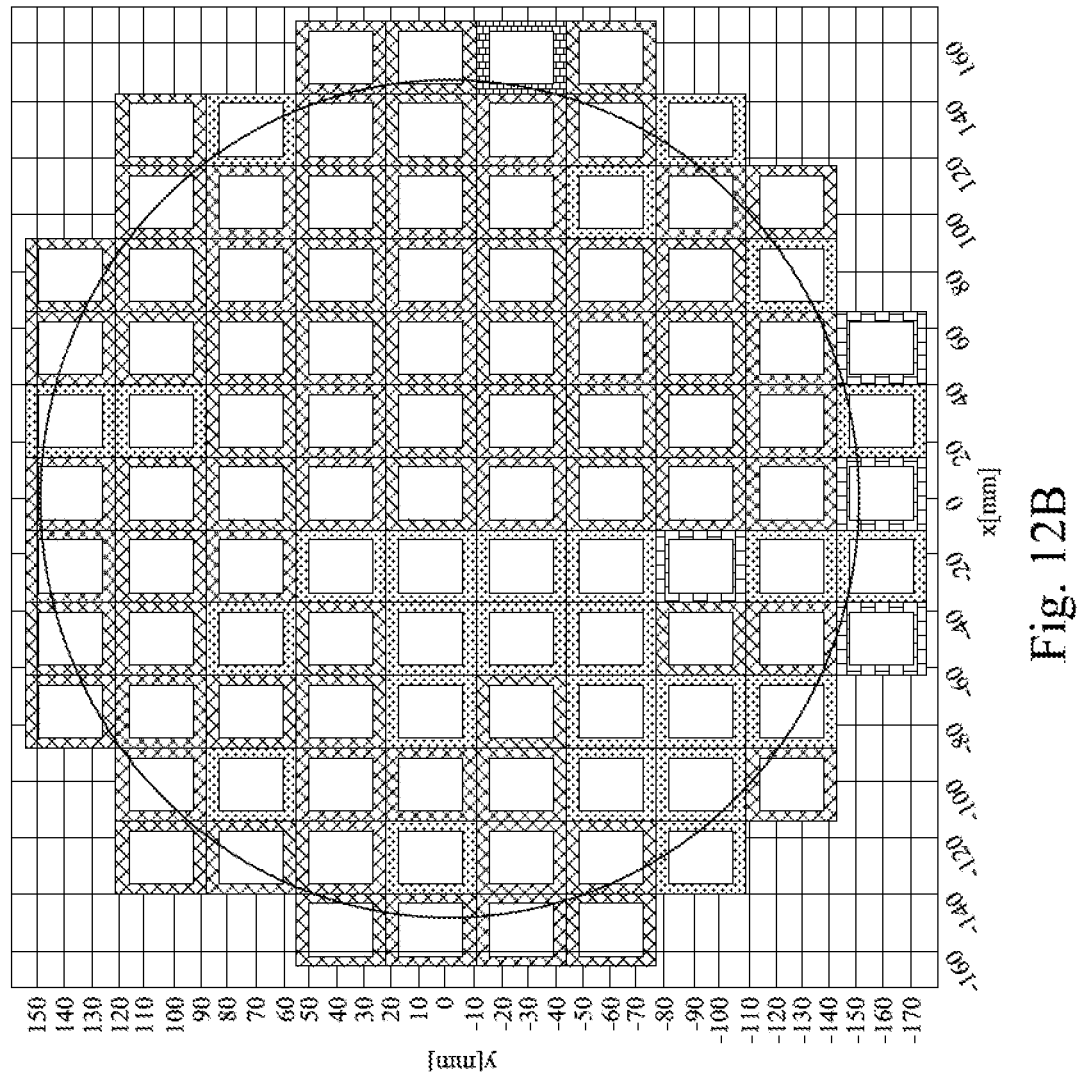

At step 1108, a scan length (B) is determined in accordance with acceleration time loss and scanner maximum time gain (i.e., default machine constant 436). At 1110, a determination is made whether A>B, whereupon operations proceed to step 1112, such that the increased scan speed gained is greater than acceleration loss, resulting in no need to limit the scan speed of the scanner 104 at 1114 (i.e., center fields 708 are only present representing full scan length (A)). Upon a determination at 1110 that the edge or center scan length (A) is less than the scan length (B), operations proceed to 1116, whereupon Eq. 1, Eq. 2, or Eq. 3 (defined above) is applied by field 708-710. Thus, at step 1118, the scanner 104 scan speed is limited to reduce acceleration time loss in short scan length field(s) (e.g., edge fields 710), thus resulting in more throughput than a no limit scan speed application in relatively small scan length field (i.e., edge fields 710) at step 1120. FIGS. 12A and 12B provide comparative examples of output performance in accordance with some embodiments. The illustration of FIG. 12A depicts an output that does not use the systems and methods set forth herein and FIG. 12B depicts an output utilizing the systems and methods set forth above.

In accordance with a first embodiment, there is provided a method for optimizing scan speed for increased throughput in a lithography device. The method includes receiving a process design layout corresponding to a plurality of fields to be formed on an associated wafer, and determining a field scan length in accordance with the received process design layout. The method also includes identifying a type of each row of fields corresponding to the received process design layout. The type of row of field is selected from the group consisting of a center fields row, an edge fields row, or an edge and center field combined row. The method further includes determining a center field row scan speed for row identified as a center fields row, an edge field row scan speed for each row identified as an edge fields row, and an edge and center field combined row scan speed for row identified as an edge and center field combined row. In such an instance, the edge and center field combined row scan speed utilizes the center field row scan speed for each center field in the edge and center field combined row and the edge field scan speed for each edge field in the edge and center field combined row. Thereafter, the associated wafer is processed utilizing the center field row scan speed, the edge field scan speed, and the edge and center field combined scan speed in accordance with the process design layout.

In accordance with a second embodiment, there is provided a method for optimizing scan speed of a lithography scanner. The method includes receiving a process design layout corresponding to a plurality of rows of fields to be formed on an associated wafer. The method further includes determining a default machine constant of the lithography device, and identifying a type of each of the plurality of rows of fields corresponding to the received process design layout. The method also includes determining a scan speed in accordance with the determined type of row and the determined default machine constant. The associated wafer is then processed utilizing the determined scan speed for each of the plurality of rows in accordance with the process design layout.

In accordance with a third embodiment, there is provided a system for system for optimizing the scan speed of a lithographic scanner. The system includes a reticle stage assembly, a wafer stage assembly, and a controller. The reticle stage assembly includes a reticle, and one or more motors for movement in the x-direction and the y-direction. The wafer stage assembly includes a wafer stage body, and a wafer retention component configured to hold a wafer. The controller includes a processor that is in communication with memory. The memory stores instructions which are executed by the processor to receive a process design layout corresponding to a plurality of fields to be formed on the wafer, and to identify each of the fields as a center field or an edge field. The memory further stores instructions to determine, via a scan speed determination component, an optimum scan speed for each field in the plurality thereof in accordance with the identified field type, and activate, via a motor control component, the one or more motors based on the determined optimum scan speed for each field.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for optimizing scan speed for increased throughput in a lithography device, the lithography device including a reticle assembly stage and a wafer assembly stage, the method comprising:
    receiving a process design layout corresponding to a plurality of fields to be formed on an associated wafer;
    determining a full field scan length in accordance with the received process design layout;
    determining a default machine constant including determining a movement speed of the reticle assembly stage and determining a movement speed of the wafer assembly stage;
    identifying a type of each of a plurality of rows of fields corresponding to the received process design layout, wherein the type of row of field is selected from a group including a center fields row, an edge fields row, or an edge and center field combined row;
    determining a center field row scan speed for each of the plurality of rows identified as a center fields row;
    determining an edge field row scan speed for each of the plurality of rows identified as an edge fields row;
    determining an edge and center field combined row scan speed for each of the plurality of rows identified as an edge and center field combined row, wherein the edge and center field combined row scan speed utilizes the center field row scan speed for each center field in the edge and center field combined row and the edge field scan speed for each edge field in the edge and center field combined row; and
    processing the associated wafer utilizing the center field row scan speed, the edge field scan speed, and the edge and center field combined scan speed in accordance with the process design layout;
    wherein each center field is the full scan length and each edge field has a scan length less than the full scan length;
    wherein determining the center field row scan speed, the edge field scan speed, and the edge and center field combined scan speed is performed in accordance with the default machine constant; and
    wherein determining the center field row scan speed further comprises differentiating a scan time of the lithography device and an acceleration time of the reticle stage assembly.

2. The method of claim 1 wherein determining the edge field row scan speed further comprises determining an exposure time, a scan length and a step time.

3. The method of claim 1, wherein the lithography device is an extreme ultraviolet lithography (EUV) device.

4. A method for optimizing scan speed of a lithography scanner device, the lithography scanner device including a reticle assembly stage and a wafer assembly stage, the method comprising:
    receiving a process design layout corresponding to a plurality of rows of fields to be formed on an associated wafer;
    determining a default machine constant of the lithography scanner;
    identifying a type of each of the plurality of rows of fields corresponding to the received process design layout, wherein the type of row of field is selected from a group including a center fields row, an edge fields row, or an edge and center field combined row;
    determining a scan speed in accordance with the determined type of row and the determined default machine constant; and processing the associated wafer utilizing the determined scan speed for each of the plurality of rows in accordance with the process design layout;

wherein determining a center field row scan speed further comprises differentiating a scan time of the lithography scanner device and an acceleration time of the reticle stage assembly.

5. The method of claim 4, wherein determining the default machine constant comprises:

determining a movement speed of the reticle assembly stage; and determining a movement speed of the wafer assembly stage.

6. The method of claim 4, wherein determining a scan speed further comprises:

determining the center field row scan speed for each of the plurality of rows identified as a center fields row;

determining an edge field row scan speed for each of the plurality of rows identified as an edge fields row; and determining an edge and center field combined row scan speed for each of the plurality of rows identified as an edge and center field combined row, wherein the edge and center field combined row scan speed utilizes the center field row scan speed for each center field in the edge and center field combined row and the edge field scan speed for each edge field in the edge and center field combined row.

7. The method of claim 6, wherein determining the center field row scan speed, the edge field scan speed, and the edge and center field combined scan speed is performed in accordance with the default machine constant.

8. The method of claim 7, wherein the determined edge field row scan speed is less than or equal to the center field row scan speed in accordance with a scan length and the default machine constant.

9. The method of claim 4, wherein each center field is a full scan length and each edge field has a scan length less than a full scan length.

10. The method of claim 4, wherein determining the edge field row scan speed further comprises determining an exposure time, a scan length, and a step time.

11. The method of claim 4, wherein the lithography scanner device is an extreme ultraviolet lithography (EUV) device.

12. The method of claim 4, wherein determining the default machine constant comprises retrieving the default machine constant from a database.

13. A system for optimizing scan speed of a lithographic scanner device, the system comprising:

a reticle stage assembly, comprising a reticle and at least one motor for movement in the x-direction and the y-direction;

a wafer stage assembly, comprising a wafer stage body and a wafer retention component configured to hold a wafer thereon; and a controller comprising a processor in communication with memory storing instructions which are executed by the processor to:

receive a process design layout corresponding to a plurality of fields to be formed on the wafer, identify, via a field identification component, each of the plurality of fields as a center field or an edge field, determine, via a scan speed determination component;

a center field row scan speed for each of a plurality of rows identified as a center fields row;

an edge field row scan speed for each of a plurality of rows identified as an edge fields row;

an edge and center field combined row scan speed for each of a plurality of rows identified as an edge and center field combined row, wherein the edge and center field combined row scan speed utilizes the center field row scan speed for each center field in the edge and center field combined row and the edge field scan speed for each edge field in the edge and center field combined row; and an optimum scan speed for each field in the plurality of fields in accordance with the identified field type and a default machine constant, wherein determining an optimum scan speed for the center field comprises differentiating a scan time of the lithographic scanner device and an acceleration time of the reticle stage assembly, and activate, via a motor control component, the at least one motor in accordance with the determined optimum scan speed for each of the plurality of fields.

14. The system of claim 13, wherein the memory further stores instructions to determine the default machine constant.

15. The system of claim 14, wherein the default machine constant corresponds to a movement speed of the reticle assembly stage, and a movement speed of the wafer assembly stage.

16. The system of claim 13, wherein each of the center field row scan speed, the edge field row scan speed and the edge and center field combined row scan speed are determined in accordance with the default machine constant.

17. The system of claim 16, wherein the determined edge field row scan speed is less than or equal to the center field row scan speed in accordance with a field size and the default machine constant.

18. The system of claim 13, wherein each center field is the full scan length and each edge field has a scan length less than a full scan length.

19. The system of claim 13, wherein determining the edge field row scan speed further comprises determining an exposure time, a scan length, and a step time.

20. The system of claim 13, wherein the lithographic scanner device is an extreme ultraviolet lithography (EUV) device.

\* \* \* \* \*